(12) United States Patent
Ohmi et al.

(10) Patent No.: US 7,185,421 B1
(45) Date of Patent: Mar. 6, 2007

(54) METHOD AND APPARATUS FOR MANUFACTURING MULTILAYER PRINTED WIRING BOARD

(75) Inventors: Tadahiro Ohmi, 1-17-301, Komegabukuro 2-chome, Aoba-ku, Sendai-shi, Miyagi-ken 980-0813 (JP); Hidetoshi Murakami, Iwate (JP)

(73) Assignees: Tadahiro Ohmi, Miyagi-ken (JP); Kabushiki Kaisha Daishodenshi, Tokyo (JP)

( * ) Notice: Subject to any disclaimer, the term of this patent is extended or adjusted under 35 U.S.C. 154(b) by 52 days.

(21) Appl. No.: 10/049,499

(22) PCT Filed: Aug. 11, 2000

(86) PCT No.: PCT/JP00/05393

§ 371 (c)(1),
(2), (4) Date: Jun. 21, 2002

(87) PCT Pub. No.: WO01/13688

PCT Pub. Date: Feb. 22, 2001

(30) Foreign Application Priority Data

Aug. 13, 1999 (JP) .................................. 11/229522

(51) Int. Cl.
*H05K 3/36* (2006.01)

(52) U.S. Cl. ........................... 29/830; 29/825; 29/832; 156/89.11; 156/89.15; 156/89.17

(58) Field of Classification Search .................. 29/825, 29/830, 832, 840; 156/89.11, 89.17, 89.18, 156/89.19, 89.15
See application file for complete search history.

(56) References Cited

U.S. PATENT DOCUMENTS

| 5,683,529 | A | * | 11/1997 | Makihara et al. | ......... | 156/89.15 |
| 5,685,327 | A | * | 11/1997 | Mohindra et al. | ......... | 134/95.2 |
| 5,735,451 | A | * | 4/1998 | Mori et al. | ................. | 228/206 |

FOREIGN PATENT DOCUMENTS

| JP | 3-296479 | 12/1991 |
| JP | 5-261718 | 10/1993 |
| JP | 11-20113 | 1/1999 |

* cited by examiner

Primary Examiner—Carl J. Arbes
(74) Attorney, Agent, or Firm—Young & Thompson

(57) ABSTRACT

The present invention has an object to provide a producing method and producing apparatus of multilayered printed-circuit board that has eliminated the resin flow and resolved the problems of board thickness discrepancy and misregistration.

A producing method of multilayered printed-circuit board, comprising steps of stacking up a laminated sheet covered with conductive foil or conductor for outer layer, a prepreg and a laminated sheet covered with conductor for inner layer and, thereafter, setting the prepreg by pressurizing/heating, wherein, before conducting the pressurizing/heating, gas is sprayed to the surface of the laminated shoot covered with conductive foil or conductor for outer layer, a prepreg and a laminated sheet covered with conductor for inner layer to eliminate impurities from the surface.

11 Claims, 3 Drawing Sheets

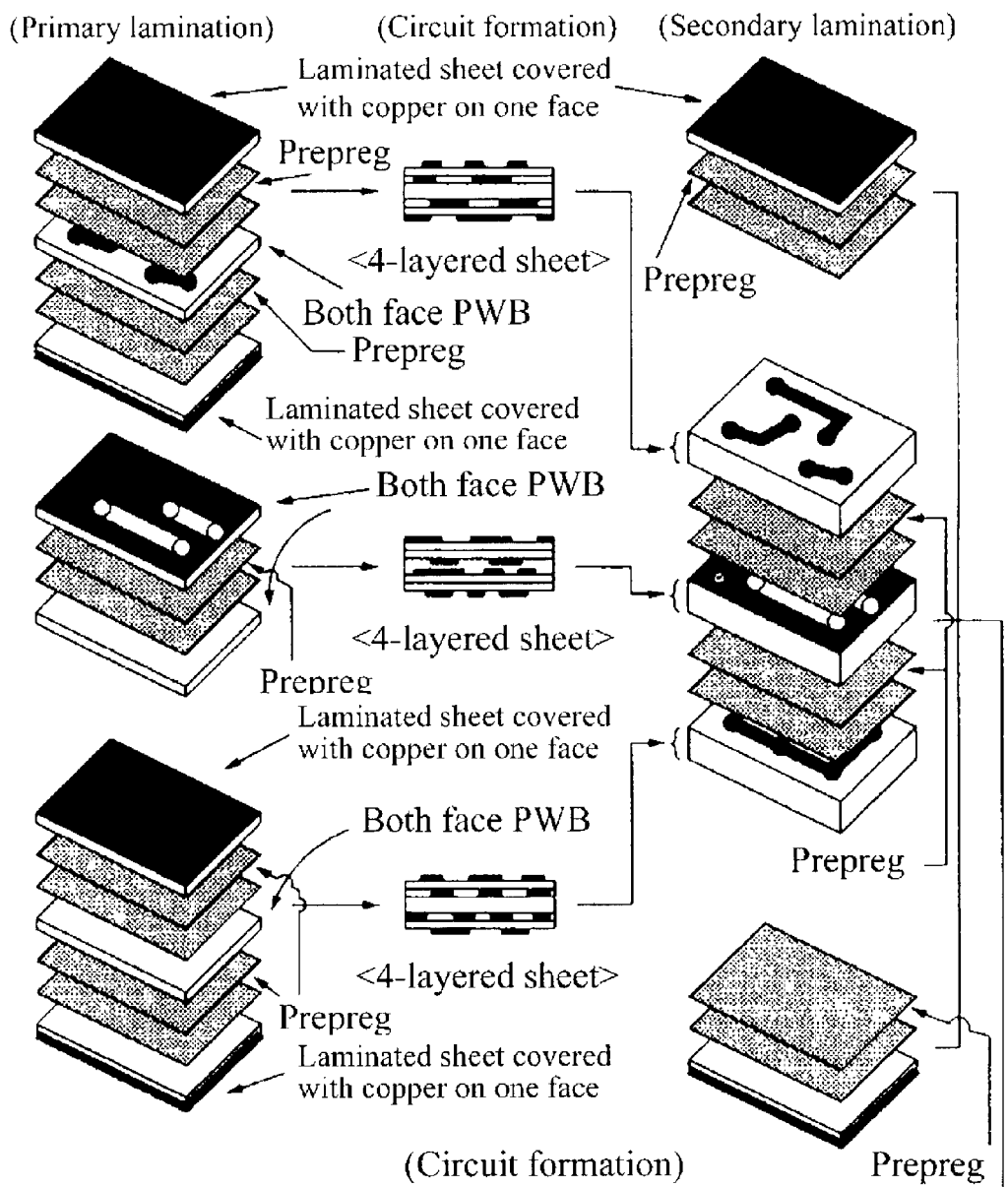
FIG.2
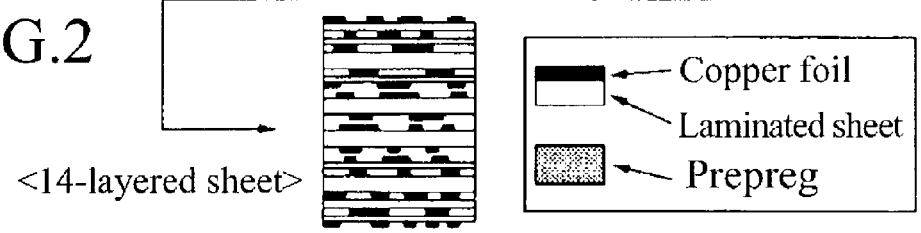

METHOD AND APPARATUS FOR MANUFACTURING MULTILAYER PRINTED WIRING BOARD

BACKGROUND OF THE SPECIFICATION

1. Field of the Invention

The present invention concerns a method of producing multilayered printed-circuit boards and a producing apparatus thereof, and more particularly a method of producing multilayered printed-circuit boards appropriate for preparing a multilayered printed-circuit board appropriate for a package containing semiconductor devices provided with wiring layers comprising mainly of low resistance metals such as copper or through hole conductors filled with metal paste or others material on a surface of an insulating layer containing organic resins and an apparatus for producing same.

2. Background of the Related Art

Conventionally, a method for producing multilayered printed-circuit boards, a technique is utilized comprising the steps of laminating an inner layer material (core material) where a circuit is formed on an dielectric cover and an outer layer material (or conductive foil) through a prepreg, and adhering the inner layer material and the outer layer material by pressurizing and heating them to multilayer.

More in detail, the method comprised the following steps:
1. Perforation of a reference hole in the inner layer material
2. Circuit formation by etching (photolitho process) a copper foil of the inner layer
3. Black oxide treatment of the copper The black oxide treatment is performed for the purpose of improvement of resin wetting by forming carpet-shaped pile through oxidation of the copper foil surface for increasing the adhesion resistance between the copper foil and the prepreg, and more specifically, it is performed by the following steps.

Degreasing is followed by soft etching (e.g., chemically roughing the circuit surface of the core material to prepare the board for black oxide treatment) then followed by sulfuric acid washing (having the purpose of removing debris generated by soft etching and rinse) then predep. (a common chemical treatment for preventing liquid from dragging in the black oxide treatment tank) then black oxide treatment then drying (to remove moisture of black oxide treatment).

4. Laminating press
5. Through hole perforation
6. Through hole inner wall covering
7. Circuit formation by etching of copper foil of outer layer (photolitho process)
8. Shape processing The laminating press process consists in setting and adhering a non-set resin of the prepreg through pressurizing and heating of blacking treated core material, prepreg and outer layer material (or copper foil).

Conventionally, in the case of using epoxy resin as prepreg, the laminating press process has been carried out under a pressure of 20 to 40 kg/cm$^2$, temperature equal or superior to 170° C. for 20 minutes or longer.

However, in the conventional producing method mentioned above, there was an inconveniency that the resin flowed in quantity after setting, the board thickness was irregular, and the workability was impeded.

On the other hand, recently, black oxide treatment is required also for the high-integration of the multilayered printed-circuit board. As a technology to cope with such requirement, a so-called blind hole technology is being developed. This consists in perforating a through hole beforehand (before press lamination) in the insulator board of the inner layer, covering the through hole with copper, or filling the through hole with conductive paste (thermosetting resin mixed with conductive powder) to obtain a through hole conductor. Such technology is a technology allowing to realize a high black oxide treatment of multilayered printed-circuit board.

However, in the case of applying the aforementioned conventional producing method of multilayered printed-circuit board to such blind hole technology, there was a problem of inhibiting to cope with the filing because of dislocation between a plurality of layers.

The present invention resolves problems of the aforementioned conventional technology, and has an object to provide a method of producing multilayered printed-circuit board that has eliminated the resin flow and resolved the problems of board thickness discrepancy and misregistration.

Thereby, it has an object of providing a method of producing highly multilayered and highly precise multilayered printed-circuit boards and producing apparatus maintaining a good productivity and a high reliability.

The present invention has an object to provide an apparatus of producing multilayered printed-circuit board that has limited the board thickness dispersions, improved the workability and eliminated misregistration.

SUMMARY OF THE INVENTION

The method of producing multilayered printed-circuit boards of the present invention comprises steps of stacking up a laminated sheet covered with conductive foil or a conductor for outer layer, a prepreg and a laminated sheet covered with a conductor for an inner layer and, thereafter, setting the prepreg by pressurizing/heating and is characterized by that, before conducting the pressurizing/heating, gas or fluid is sprayed to the surface of the laminated sheet covered with conductive foil or the conductor for the outer layer, a prepreg and a laminated sheet covered with conductor for the inner layer to eliminate impurities from the surface.

The method of producing multilayered printed-circuit boards of the present invention comprises steps of preparing a plurality of wiring boards having a circuit formed with conductive foil, and having through holes covered with copper or filled with conductive paste, and multilayering by pressurizing/heating the plurality of wiring boards each other, and is characterized by that gas is sprayed to the surface of the wiring board for eliminating impurities from the surface.

The apparatus for producing multilayered printed-circuit board of the present invention comprises a movable table for laminating and pressurizing molded works each other, and means for heating said molded works and, is characterized by that the space for pressurizing the molded works is hermetically closed and the closed space is provided with an inlet for introducing gas therein and an outlet for discharging the gas.

Function

Now, functions of the present invention shall be described together with findings in the course of achieving the present invention.

In the method of producing multilayered printed-circuit boards, the resin flow was important, the discrepancy of board thickness was large, the workability was inhibited, and the misregistration was provoked; however, the Inventor has studied diligently the reason thereof, and found that the reason consists in impurities (especially humidity) remaining on the surface of molded works (e.g., outer layer material, conductive foil, inner layer material, prepreg or others).

In short, before the laminating press process, the inner layer material is submitted to the black oxide treatment, which is a wet treatment depositing humidity on the surface. Though humidity was removed by drying (120° C.) after black oxide treatment, the humidity was not removed sufficiently. In addition, exposure to the atmosphere between drying and laminating press provoked the deposition of humidity.

In the case of a laminating press with humidity deposited to the surface of molded works, peeling-off or swelling are provoked.

On the other hand, it was obliged to increase the press pressure in order to laminate completely while maintaining the adhesion force; consequently, a high press pressure as 20 to 40 kg/cm$^2$ was used.

However, such a high press pressure, increased the resin flow, and provoked various problems.

On the other hand, in case when humidity or other impurities are eliminated, it was found that the adhesion force can be maintained even under a low press pressure.

It may enough to flow gas over the surface of a molded work to eliminate impurities. The compression space for the laminating press is purged by closing and flowing gas in this space, moisture or other impurities are taken away from the surface of a molded work by the gas, and impurities are removed from the surface. The gas is preferable inert (preferably argon gas, nitrogen gas). Particularly, the impurity concentration in the gas is preferably equal or less than 50 ppb, and more preferably equal or less than 10 ppb. The use of such high purity gas allows to prevent impurities from being brought from the gas. The gas pressure may be a normal pressure.

Besides, the gas is flowed preferably in a direction horizontal to the laminating face of the molded work.

Further, it is preferable to heat the molded work when flowing the gas. The heating temperature is preferably 60° C. to 70° C. An excessively high temperature sets the prepreg.

BRIEF DESCRIPTION OF DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 2 is a flow chart showing steps of a method producing multilayered printed-circuit board according to an example of the present invention.

Corresponding reference characters indicate corresponding parts throughout the several views. The exemplification set out herein illustrates one preferred embodiment of the invention, in one form, and such exemplification is not to be construed as limiting the scope of the invention in any manner.

Figure 1:
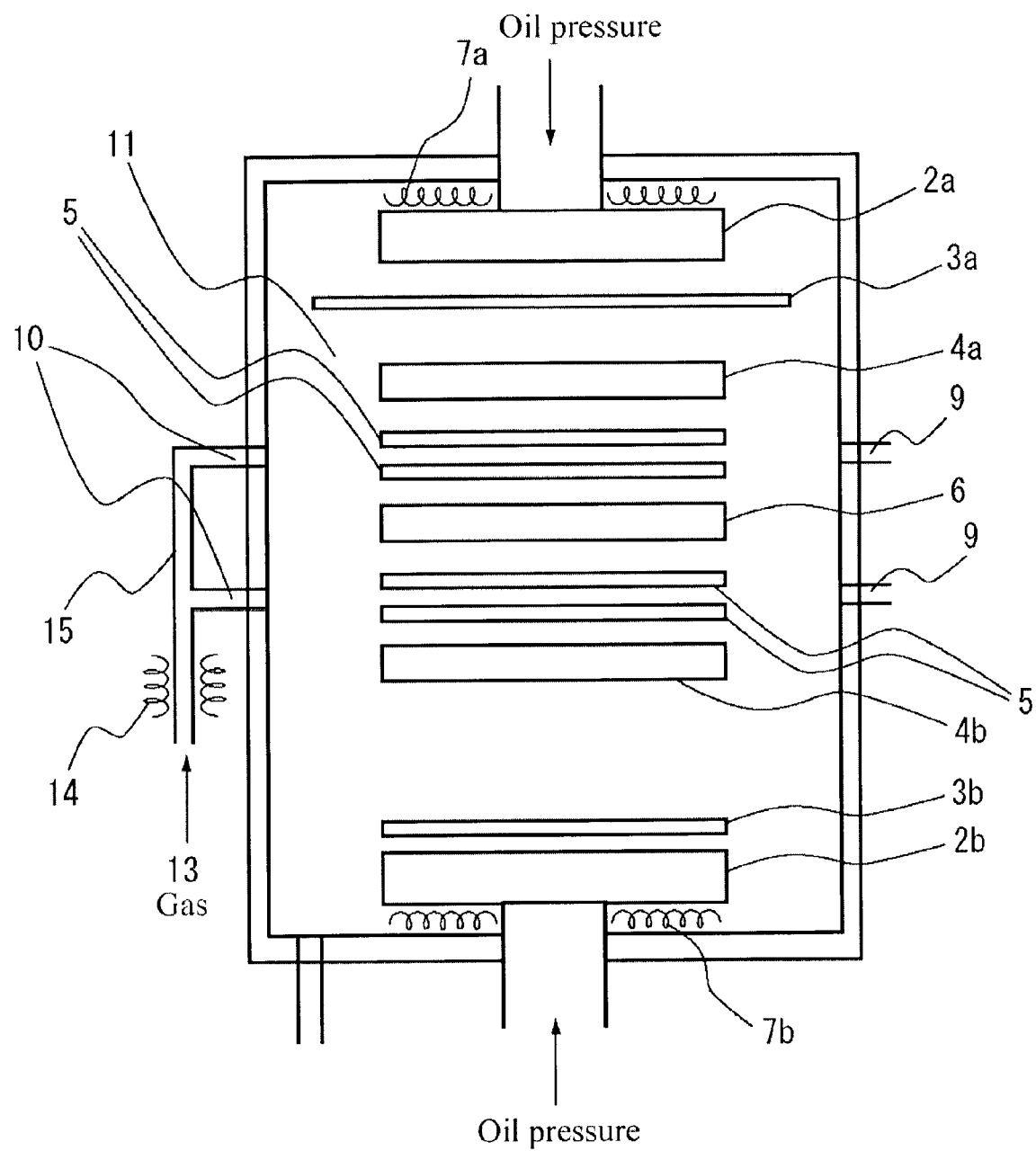
FIG. 1 is a section of an apparatus producing multilayered printed-circuit boards according to an embodiment of the present invention.

DESCRIPTION OF SYMBOLS 2a, 2b Die (cover)
3a, 3b Stainless board
4a, 4b Laminated sheet covered with copper for outer layer
5 Prepreg
6 Laminated sheet covered with copper for inner layer
7a, 7b Heater or heating by heat transfer oil
9 Outlet
10 Inlet
11 Space
13 Gas (gas)
14 Heater
15 Gas supply pipe.

DETAILED DESCRIPTION OF THE INVENTION

BEST MODE OF CARRYING OUT THE INVENTION (Laminated Sheet Covered with Electric Conductor for Inner Layer)

The laminated sheet covered with an electric conductor for the inner layer is an inner layer material and, here, the inner layer includes a signal layer, power supply layer, ground layer or other conductive patterns placed inside the board other than conductive patterns placed in the outsides which are the surface or back outer layers of a multilayered printed-wiring board.

Conductors include generally copper or copper alloys. As other conductors, for example, silver, aluminum, gold or alloys containing one or more of them, and, Ni—Cr alloy or the like are used.

It is preferable to apply the inner layer circuit surface treatment to the inner layer. The inner layer circuit surface treatment is a surface treatment for creating a fine relief on the conductor surface in order to improve the adhesion force of the inner layer circuit. Black oxide treatment, copper oxide reduction method, micro-etching method, electroless method and DT (double treatment) cooper foil or others can be enumerated.

As a base member (inner layer material) for covering electric conductors composing a laminated sheet, thermosetting resins such as epoxy resin, polyimide resin or other resins, laminated sheets having impregnating glass with them, aluminum nitride, silicon carbide, alumina or other ceramics are used.

(Laminated Sheet Covered with Electric Conductor for Outer Layer)

The outer layer is a layer of conductor patterns on both faces of a multilayered printed-wiring board.

The electric conductor is similar to the laminated sheet covered with electric conductor for inner layer.

An electric conductor foil may be used in place of a laminated sheet covered with electric conductor for an outer layer.

(Prepreg)

Prepreg is an adhesion sheet made into a half set B stage state by impregnating a glass cloth of reinforcing material with a thermosetting resin.

As thermosetting resin, phenol resin, epoxy resin, polyimide resin, altered polyimide resin, urea resin, melamine resin, silicone resin, polyurethane resin, non saturated polyester resin, aril resin or others can be cited.

Also, fillers can be combined with them in order to increase the strength of the wiring board.

(Through Hole)

In case of forming a through hole after the laminating press, perforation may be performed by a drill or the like and then, the inner wall of the through hole may be covered or coated.

In case of a via hole, the perforation is performed in the prepreg by a publicly known method such as drill, punching, sandblast, laser or others.

Then, the hole inside is covered with copper or filled with electric conductor paste. The electric conductor paste is prepared by kneading an electric conductor powder and a binder made of thermal conductive resin. As an electric conductor, copper, silver, aluminum or other metals are used. As thermosetting resin, those mentioned above may be used.

The hole inside is filled with a sufficient quantity of electric conductive paste, the electric conductive paste is set, and flushed by polishing or the like.

As a through hole, holes of 30 μm in diameter may be opened with an interval of 30 μm.

While the gap of through hole conductor was as large as 150 μm in the related art, as it is possible to reduce the gap of through hole conductor to ±20 μm in the present invention, no connection deficiency appears even for diameter 50 μm and interval 50 μm.

(Impurity Elimination)

In the present invention, impurities, mainly moisture, are removed from the surface of the molded work, before performing on the laminating press. The molded work is placed in the space for laminating before removing impurities. In short, after arrangement in the space, impurities are removed from the surface of the molded work by flowing gas of high purity in the space and purging the space. Purge time and frequency are not necessarily evident; however, the relation between time/frequency and moisture elimination quantity may be determined beforehand by experiment using a real press machine, and they may be decided based on the results thereof.

It should be appreciated that is it important to eliminate impurities just before performing the press lamination. Because, even if moisture is removed out of the space for performing the laminating press, impurities such as moisture deposit instantaneously on the surface of a molded work if the same is exposed to the atmosphere during the ulterior transport to the space for performing the laminating press. It is the case even in a clean room. Nonetheless, the effect of the present invention can be achieved similarly in the case of eliminating impurities outside the space for press lamination and, thereafter, the molded work is contained in a transport box or the like whose inside is isolated from the atmosphere, and transported to the space for press lamination.

As gas, a dry gas not containing moisture is preferable. Besides, it is preferable to use a heated gas. As for gas temperature, 60° C. to 70° C. is preferable.

It should be appreciated that it is necessary to arrange disposing interstices between molded works in order to eliminate impurities in the space for performing the laminating press and, for instance, a hand for holding the molded work at the corner section or side face of the molded work may be provided in an advanceable/retractable state. The molded work, floats in a state placed on the hand, then gas is flowed in this state to remove impurities, and after impurity elimination, the hand is retracted, and molded works are laminated to each other before performing the press lamination.

(Press Lamination)

In the present invention, as pressurizing pressure for performing the press lamination, a pressure less than the related art, 15 kg/cm$^2$ is used preferably. A multilayered printed-circuit board with good adhesion without swelling can be obtained even under such a low pressure.

The press lamination may be performed by any of pin lamination method, mass lamination method, or sequential lamination method.

(Laminating Apparatus)

FIG. 1 shows a producing apparatus of multilayered printed-circuit board according to an embodiment of the present invention.

The apparatus comprises die covers 2a, 2b for laminating and pressurizing the molded works (for example, laminated sheets covered with copper for outer layer 4a, 4b, laminated sheets covered with copper for inner layer 6), each other, and means for heating the molded works 4a, 4b, 6 (heater 7a, 7b). A space 11 for pressurizing the molded works 4a, 4b, 6 is closed and, at the same time, the closed space 11 is provided with an inlet 10 for introducing gas 13 therein and an outlet 9 for discharging the gas.

In this example, the inlet 10 is disposed at two points, and arranged to flow the gas in parallel with the laminated surface of the molded works 4a, 4b, 6. Two or more inlets 10 may be installed. Besides, a heater 14 for heating the gas is disposed in the middle of gas supply pipe 15.

On the other hand, the outlet 9 is disposed at an opposed position across the inlet 10 and the space 11. Consequently, the gas convection is reduced, and impurities are removed more efficiently.

EXAMPLES

Example 1

Laminated sheets covered with copper for outer layer 4a, 4b, a laminated sheet covered with copper for outer layer 6 and a prepreg 5 as glue were prepared, stacked and perforated with a reference hole.

In this example, epoxy resin was used for the outer layer material of the laminated sheet covered with copper for outer layer 4a, 4b and for the inner layer material of the laminated sheet covered with copper for inner layer 6. Also, as prepreg, a glass cloth impregnated with epoxy resin was used.

After perforating the reference hole, only the laminated sheet covered with copper for inner layer 6 was taken out, and an inner layer pattern based on the design was formed.

Then, the copper foil surface of the inner layer pattern was covered with black oxide as a roughening treatment.

The prepreg was put between the laminated sheet covered with copper for inner layer 6 and the laminated sheet covered with copper for outer layer 4a, 4b.

However, an interstice was provided between the laminated sheets covered with copper for outer layer 4a, 4b, laminated sheet covered with copper for outer layer 6 and prepreg 5 and gas introduced into the space 11 from the inlet 10 and heated to 70° C. circulated in parallel to the laminated face. It should be appreciated that, for instance, the corner section of the sheet may made supportable by a point, in order to dispose a space between the laminated sheets covered with copper for outer layer, laminated sheet covered with copper for outer layer and prepreg to the gas.

A guide pin was passed through the reference hole opened in the previous step, and a relative misregistration among respective layer conductor patterns is prevented.

They (the lamination) are pressed by stainless steel board 3a, 3b and press laminated. The temperature was 170° C., time 30 min and pressure 15 kg/cm$^2$.

The quantity of resin forced out from the board end after the press lamination was measured to obtain 1 mm or less.

Next, copper of the outer layer was etched by a publicly known method, to form a wiring pattern.

The following tests were carried out for the multilayered printed-circuit board prepared as mentioned above. In short, the multilayered printed-circuit board was boiled for four (4) hours, dipped in a solder of 260° C. for 20 sec, and exfoliation and swelling were observed.

As the result of the test, no exfoliation and swelling were observed.

It should be appreciated that, in the case of setting the pressurizing pressure to 10 kg/cm$^2$, similarly, no exfoliation and swelling were observed, but in the case of setting to 8 kg/cm$^2$, a slight swelling was observed.

Example 2

In this example, the lamination was carried out by a sequential lamination method lamination method as shown in FIG. 2.

In this example also, the quantity of forced out resin was 1 mm or less between respective layers.

In addition, no exfoliation and swelling were observed.

Example 3

In this example, a through hole 21 of 50 µm in diameter was formed in a laminated sheet of epoxy resin covered with copper (thickness 80 µm) and filled with a copper paste 22 made of copper powder and cellulose, and dried.

Figure 3:
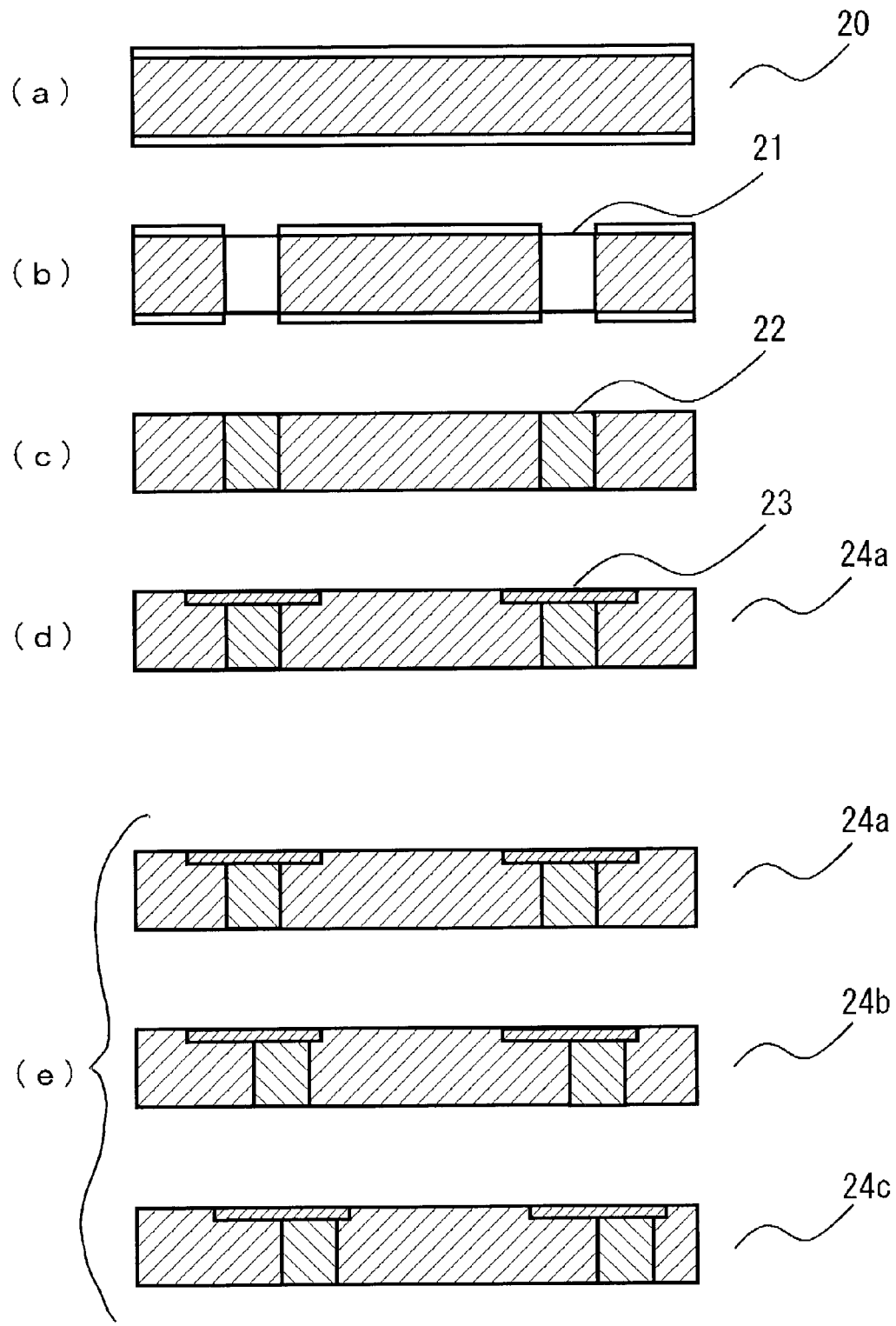
FIG. 3 is a section showing steps of the producing method of multilayered printed-circuit board according to the example of the present invention.

Moreover, a circuit pattern 23 was formed on the laminated sheet covered with copper 20 by a publicly known method, to obtain a single wiring board 24 (FIG. 3 (d)).

Single circuit boards 24a, 24b are produced according to the same procedures as the above.

Three (3) single wiring boards 24a, 24b, 24c and a prepreg were disposed in the apparatus producing a multilayered printed-circuit board shown in FIG. 1, and an argon gas of 10 ppb or less in impurity concentration was flowed into the space 11. The temperature of argon gas was set to 70° C.

Next, dies 2a, 2b were heated to 170° C., and compressed by a pressurizing pressure 15 kg/cm$^2$. The exfoliation and swelling test was conducted as in the example 1, and no exfoliation and swelling was observed.

On the other hand, deformation and misregistration of through hole conductor were measured, and the misregistration was found to be 20 µm or less.

INDUSTRIAL APPLICABILITY

According to the present invention, a multilayered printed-circuit board exempt of exfoliation and swelling and presenting considerably less misregistration of through hole conductors than the prior art can be produced.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A method of producing a multilayered printed-circuit board, comprising the steps of:
    stacking up in spaced-apart relationship at least one outer layer, at least one inner layer and at least one prepreg to form a stacked formation, the at least one outer layer including a laminated sheet covered with conductive foil or conductor, the at least one inner layer including a laminated sheet covered with conductor; thereafter,
    laminating the stacked formation to provide a lamination and then setting the prepreg by pressurizing/heating the lamination; and
    before conducting the laminating and the pressurizing/heating operations, flowing a gas over and into contact with the surfaces of the stacked formation to eliminate impurities from the surfaces.

2. The method according to claim 1, wherein said gas is a dried gas.

3. The method according to claim 2, wherein said dry gas is a heated gas.

4. A method of producing a multilayered printed-circuit board, comprising the steps of:
    preparing a plurality of wiring boards having a circuit formed with conductive foil, and having through holes filled with a through hole conductor;
    disposing the wiring boards in stacked spaced-apart relationship to one another to form a stacked formation;
    multilayering by laminating the stacked formation to provide a lamination and then pressurizing/heating the lamination; and
    prior to conducting the laminating and pressurizing/heating operations, flowing a gas over and into contact with the surfaces of the wiring boards in the stacked formation to eliminate impurities from the wiring board surfaces.

5. The method according to claim 1, wherein the pressure during said pressurizing step is between 10 to 15 kgf/cm$^2$.

6. A method of producing a multilayered printed-circuit board, comprising the steps of:
    providing a plurality of layers in stacked spaced-apart relationship to one another to define a stacked formation;
    laminating the stacked formation to provide a lamination; and
    prior to the laminating operation, flowing a gas over and into contact with the surfaces of the stacked formation to remove impurities from the surfaces.

7. The method as recited in claim 6 further includes the step of:
    pressurizing/heating the lamination.

8. The method as recited in claim 6 wherein the plurality of layers further includes at least one outer layer, at least one inner layer, and at least one prepreg, the at least one outer layer including a laminated sheet covered with conductive foil or conductor, the at least one inner layer including a laminated sheet covered with conductor.

9. The method as recited in claim 8 further includes the step of:
    pressurizing/heating the lamination to set the prepreg.

10. The method as recited in claim 6 wherein the plurality of layers further includes a plurality of wiring boards.

11. The method as recited in claim 10 further includes the step of:
    pressurizing/heating the lamination.

* * * * *